(12) United States Patent
Hur

(10) Patent No.: US 6,646,334 B2
(45) Date of Patent: Nov. 11, 2003

(54) STACKED SEMICONDUCTOR PACKAGE AND FABRICATING METHOD THEREOF

(75) Inventor: Ki-Rok Hur, Choongcheongbuk-Do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 32 days.

(21) Appl. No.: 09/752,727

(22) Filed: Jan. 3, 2001

(65) Prior Publication Data

US 2001/0006258 A1 Jul. 5, 2001

(30) Foreign Application Priority Data

Jan. 4, 2000  (KR) .............................................. 2000-131

(51) Int. Cl.⁷ .............................................. H01L 23/02
(52) U.S. Cl. ........................ 257/686; 257/675; 257/712; 257/777
(58) Field of Search ................................ 257/675, 686, 257/690, 712–713, 723, 778, 780, 685, 777, 796

(56) References Cited

U.S. PATENT DOCUMENTS

| | | | | |
|---|---|---|---|---|
| 5,200,809 A | * | 4/1993 | Kwon ........................ 257/707 |
| 5,608,265 A | * | 3/1997 | Kitano et al. ............... 257/685 |
| 5,909,058 A | * | 6/1999 | Yano et al. .................. 257/712 |
| 6,020,629 A | * | 2/2000 | Farnworth et al. .......... 174/255 |
| 6,043,430 A | * | 3/2000 | Chun ......................... 174/52.4 |
| 6,097,609 A | * | 8/2000 | Kabadi ....................... 174/253 |
| 6,291,259 B1 | * | 9/2001 | Chun ......................... 438/106 |
| 6,501,165 B1 | * | 12/2002 | Farnworth et al. ........... 257/686 |

* cited by examiner

*Primary Examiner*—Amir Zarabian
*Assistant Examiner*—Jamie L. Brophy
(74) *Attorney, Agent, or Firm*—Morgan, Lewis & Bockius LLP

(57) ABSTRACT

A stacked semiconductor package including: a first chip; a plurality of first leads of which one side of each of the first leads is attached to the first chip by an insulating adhesive member and electrically connected to the first chip; a first molding compound for sealing the first chip and the first leads, including holes for exposing a predetermined portion of each of the plurality of the first leads, and the first molding compound does not cover a side of the first leads opposite the holes; a first conductive portion formed within the holes included in the first molding compound; an external terminal electrically connected to the first conductive portion; a second chip; a plurality of second leads attached on the second chip by the insulating adhesive member, and being electrically connected to the second chip; a second molding compound for sealing the second chip and the second leads, and exposing a predetermined portion of the second leads; a plurality of conductive connection units for electrically connecting the exposed predetermined portion of the second leads and the side of the first leads not covered by the first molding compound; and a heat sink attached between the first molding compound and the second molding compound, connected to the plurality of conductive connection units, and having a side exposed outwardly.

9 Claims, 5 Drawing Sheets

STACKED SEMICONDUCTOR PACKAGE AND FABRICATING METHOD THEREOF

BACKGROUND OF THE INVENTION

1. Field of the Invention

The present invention relates to a semiconductor package, and more particularly, to a stacked chip-size semiconductor package which is capable of performing a molding process and a stacking process by a strip unit enhancing productivity, and capable of attaching a heat sink in a strip form enhancing heat releasing capacity.

2. Description of the Background Art

As electronic equipment such as laptop computers or mobile phones are in the tendency of becoming smaller and lighter on a gradual basis, a necessity for reducing the area occupied by a semiconductor package has been gradually increased.

In order to meet the requirement, a method for reducing the area of the package and a method for stacking several semiconductor chips on a single semiconductor package are used.

FIG. 1 illustrates a structure of a stacked BLP (bottom leaded package) in accordance with a conventional art.

As shown in the drawing, the first chip 1 and the second chip 2 respectively are stacked to face a chip pad (not shown) formed on respective upper surface thereof A first package 10a of the conventional stacked BLP is constructed as follows:

The plurality of first leads 3 attached on the upper surface of the first chip i by means of the insulating tape 7 are respectively connected to the chip pad (not shown) of the upper surface of the first chip through the wire 8.

Each of the first leads includes an inner lead formed by a first portion 3a attached on the first chip, a second portion 3b upwardly bent from the first portion 3a, and a third portion 3c extended from one end of the second portion 3b and parallel to the first portion 3a, and an 'L'-shaped outer lead formed by the fourth portion 3d downwardly bent from the third portion 3c and a fifth portion 3e extended from one end of the fourth portion 3d and parallel to the first portion 3a and the third portion 3c.

The first chip 1 and the inner lead portion of the first lead are sealed by a first molding compound 6a, while the opposite side surface to the first chip 1 of the third portion 3c of the first lead is not sealed by the first molding compound 6a. The outer lead portion of the first lead 3 is outwardly protruding from the first molding compound 6a.

A second package 10b of the conventional stacked BLP is constructed as follows:

A plurality of second leads 4 are attached on the upper surface of the second chip 2, facing the first chip 1, by the insulating tape. The respective second leads 4 are electrically connected to the chip pad (not shown) on the upper surface of the second chip through the wire 8.

The second lead 4 includes a first portion 4a attached on the second chip 2, a second portion 4b downwardly bent from the first portion 4a and a third portion extended from one end of the second portion 4b and parallel to the first portion 4a.

The second chip 2 and the second lead 4 are sealed by the second molding compound 6b, while the opposite side surface to the second chip 2 of the third portion 4C of the second lead is not sealed by the second molding compound 6b.

In the first package 10a and the second package 10b of the stacked BLP of the conventional art, the non-sealed portion of the third portion 3c of the first lead and the non-sealed portion of the third portion 4c of the second lead are respectively attached, electrically connected and stacked by the solder 5.

However, regarding the stacked package of the conventional art described as above, since the first package 10a and the second package 10b are separately fabricated and stacked by using a stack jig by individual unit, productivity is degraded.

In addition, since the area for releasing the heat generated when the chip is operated is limited, an additional heat sink needs to be attached outside the stacked package so as to improve an efficiency of heat release.

Also, since the package includes the outer leads, it is impossible to reduce the area of the package to as small as the chip size.

Moreover, in case that a package is desired to be additionally stacked on the upper surface of the second package 10b of the stacked package, since the electrical connection between the package is difficult, it is difficult to stack more than two chips.

SUMMARY OF THE INVENTION

Therefore, one aspect of the invention is to provide a stacked semiconductor package for which a molding process and a stacking process are performed by using a strip unit, thereby reducing the defects caused in stacking and improving productivity.

Another aspect of the invention is to provide a stacked semiconductor package in which a heat sink is included in a stacked package, thereby improving the heat releasing capacity of the stacked package.

Another aspect of the invention is to provide a stacked semiconductor package which avoids use of external leads as an external terminal thereby reducing the package size to be as small as the chip size.

The present invention also provides a stacked semiconductor package that is capable of stacking more than three chips.

To achieve these and other advantages and in accordance with the one of the purposes of the invention, as embodied and broadly described herein, there is provided a stacked semiconductor package including: a first chip; a plurality of first leads of which one side of the first leads is attached to the first chip by an insulating adhesive member and electrically connected to the first chip; a first molding compound for sealing the first chip and the first leads, including a hole for exposing a predetermined portion of each of the first leads, and exposing a predetermined portion of the side opposite to the hole of the each of the first leads; a first conductive portion formed within the hole included in the first molding compound; an external terminal electrically connected to the first conductive portion; a second chip; a plurality of second leads attached on the second chip by the insulating adhesive member, and being electrically connected to the second chip; a second molding compound for sealing the second chip and the second leads, and exposing a predetermined portion of the second leads; a plurality of conductive connection units for electrically connecting the exposed side of the predetermined portion of the second leads and the exposed side of the predetermined portion of the first leads; and a heat sink being attached between the first molding compound and the second molding compound, connected to the plurality of conductive connection units, and having a side exposed outwardly.

In order to attain the above results, there is also provided a method for fabricating a semiconductor package including the steps of: preparing a first strip including a plurality of first leads; attaching a first chip onto the first leads by using an insulating adhesive member; electrically connecting the first chip and the first leads; molding the first chip and the first strip by using a first mold and a second mold having a plurality of protrusions, and sealing the first leads except for a predetermined region thereof; forming a first conductive portion in a hole formed by the protrusion of the second mold; preparing a second strip including a plurality of second leads; attaching a second chip to the second leads by using the insulating adhesive member; electrically connecting the second chip and the second lead; molding the second chip and the second strip by using the first mold and the second mold having the plurality of protrusions, and sealing the second lead except for the predetermined region thereof; forming a second conductive portion in the hole formed by the protrusion of the second mold; facing the first lead and the predetermined region of the second lead; positioning a heat sink strip including solder balls formed spaced apart at predetermined intervals between the first leads and the second leads; arranging the first leads, the second leads and the solder balls in a row in a vertical direction; attaching the heat sink strip to the first leads and the second leads; attaching an external terminal to one end of the first conductive portion; and cutting the first strip, the second strip and the heat sink strip.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
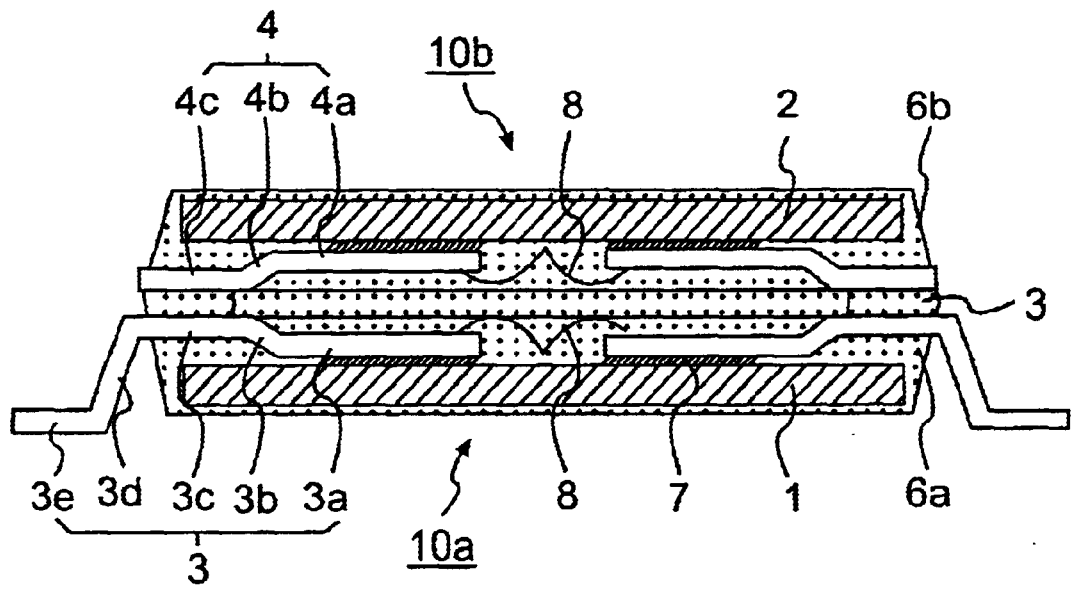
FIG. 1 is a vertical-sectional view of a stacked package in accordance with a conventional art.
Figure 2:
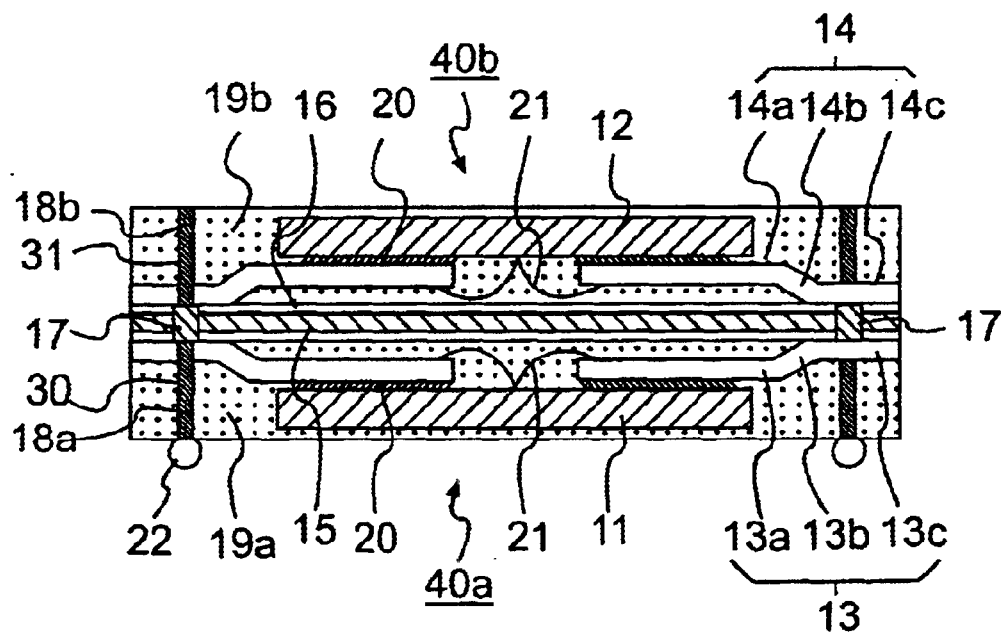
FIG. 2 is a vertical-sectional view of a stacked package in accordance with the present invention.

FIG. 2 illustrates a structure of a stacked BLP (bottom leaded package) in accordance with the present invention.

As shown in the drawing, the first chip 11 and the second chip 12 are stacked to face each other with a chip pad (not shown) therebetween formed on the upper surface of each thereof.

A first package 40a of the stacked BLP in accordance with the present invention is constructed as follows:

A plurality of first leads 13 attached on the upper surface of a first chip 11 by means of an insulating tape 20 are electrically connected to the chip pad (not shown) on the upper surface of the first chip through a wire 21, respectively.

The first lead 13 consists of a first portion 13a attached to the first chip 11, a second portion 13b upwardly bent from the first portion 13a and a third portion 13c extended from one end of the second portion 13b and parallel to the first portion 13a.

The first chip 11 and the first lead 13 are sealed by a first molding compound 19a, while the opposite side to the first chip 11, outwardly of the third portion 13c of the first lead is not sealed by the first molding compound 19a.

A plurality of holes 30, exposing a predetermined portion of the leads 13 at third portion 13c extending outwardly from the first chip 11, are formed in the first molding compound 19a.

A first conductive portion 18a typically made by the solder is formed in each of the plurality of holes 30.

One end of the first conductive 18a is exposed outwardly of the first molding compound 19a, and typically connected to an external terminal 22 made of a solder ball.

The external terminal 22 is electrically connected to the first chip 11 through the first conductive portion 18a, the first lead 13 and the wire 21.

The first package 40a can be fabricated as an independent package, rather than by stacking, by completely sealing the first chip 11 and the first lead 13 with the first molding compound 19a.

A second package 40b of the stacked BLP in accordance with the present invention is constructed as follows:

A plurality of second leads 14 are attached on the upper surface of the second chip 12 facing the first chip 11. Each of the plurality of second leads 14 is electrically connected to the chip pad (not shown) on the upper surface of the second chip through the wire 21.

The second lead 14 consists of a first portion 14a attached to the second chip 12, a second portion 14b downwardly bent from the first portion 14a and a third portion 14c extended from one end of the second portion 14b and parallel to the first portion 14a.

The first lead 13 and the second lead 14 are formed to be symmetrical.

The second chip 12 and the second lead 14 are sealed by the second molding compound 19b, while the opposite side to the second chip 12 out of the third portion 14c of the second lead is not sealed by the second molding compound 19b.

A plurality of holes 31, exposing the third portion 14c of each of the plurality of second leads 14, are formed in the second molding compound 19b.

A second conductive portion 18b typically made of the solder is formed in each of the plurality of holes 31.

One end of the second conductive portion 18b is exposed outwardly of the second molding compound 19b, and the second conductive portion 18b is electrically connected to the second chip 12 through the wire 21 and the second lead 14.

The first package 40a and the second package 40b of the stacked BLP in accordance with the present invention are stacked in a manner that the non-sealed portion of the third portion 13c of the first lead and the non-sealed portion of the third portion 14c of the second lead are attached by means of the conductive connection unit 17 and then electrically connected.

The conductive connection unit is typically made of the solder.

A bar-type heat sink 15 is included between the first package 40a and the second package 40b. The bar-type heat sink 15 is made of a metal having a high conductivity, for which cooper or aluminum may be used. In the present invention, aluminum is preferably used.

The heat sink 15 is formed to be connected to the conductive connection unit 17, so that the heat generated in the first chip 11 and the second chip 12 is conducted to the conductive connection unit 17 through the first lead 13 and the second lead 14 and then released to the outside.

The heat sink 15 is attached to the first molding compound 19a, the second molding compound 19b, the first lead 13 and the second lead 14 by using an adhesive or a thermal gap 16.

In the present invention, for electrical insulation, the surface of the aluminum forming the heat sink 15 is oxidized, thereby forming an insulating oxide film.

In the stacked package in accordance with the present invention as shown in FIG. 2, there are formed the second conductive portion 18b exposed on the upper surface of the package.

Figure 3A:
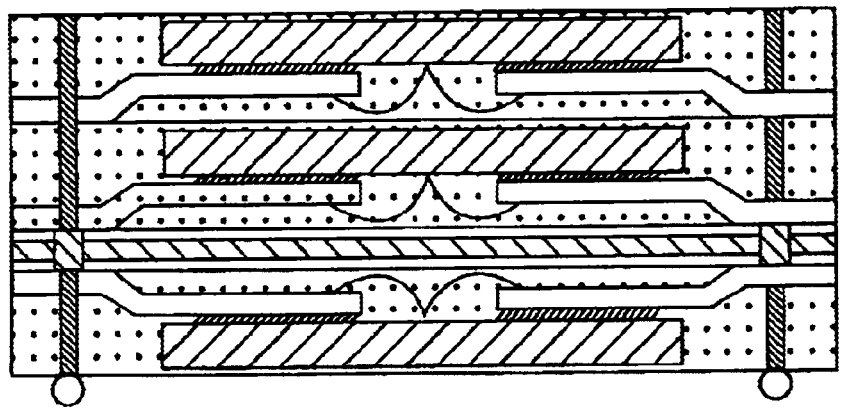
FIGS. 3A and 3B are vertical-sectional view of a stacked package that at least three chips are stacked in accordance with the present invention.
Figure 3B:
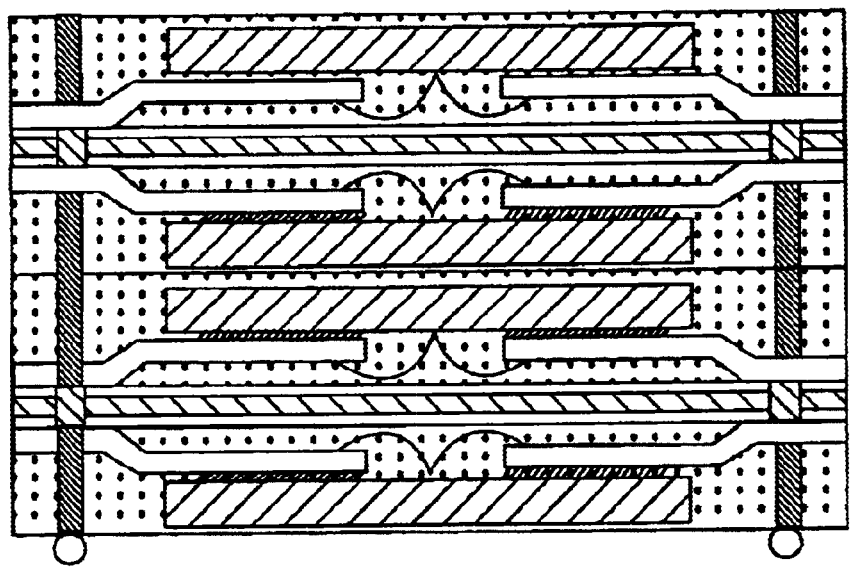

By using it, more than three chips can be stacked, of which two examples are shown in FIGS. 3A and 3B. Besides the shown examples, stacking more than three chips is possible in various forms.

Figure 4A:
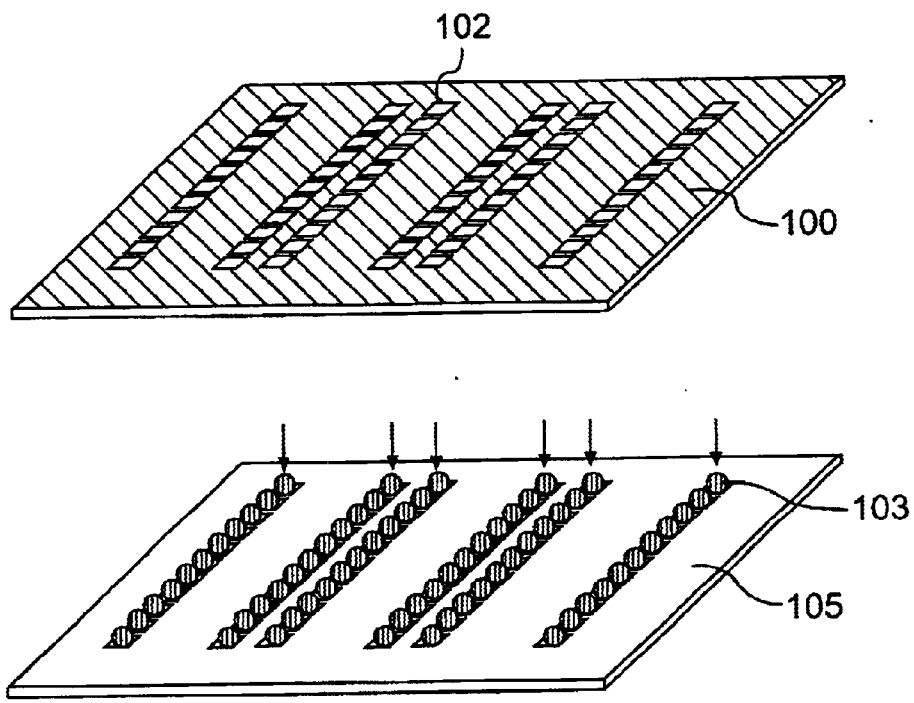
FIG. 4A is a view showing a method of fabricating a heat sink strip in accordance with the present invention.

FIG. 4A illustrates a method for fabricating the heat sink 15 in accordance with the present invention.

As shown in the drawing, all the heat sinks are fabricated at the same time by using a heat sink strip 100, rather than being fabricated separately one by one.

A plurality of holes 102 are arranged to insert the solder balls 103 in the heat sink strip 100.

The solder balls 103 lie on the substrate 105 having grooves arranged in the same form as the hole of the heat sink strip. By pressing the heat sink strip 100 onto the substrate 105, the solder balls 103 are inserted to each hole of the heat sink strip.

In the following process, the heat sink strip 100 is cut and divided into a plurality of heat sinks.

Figure 4B:
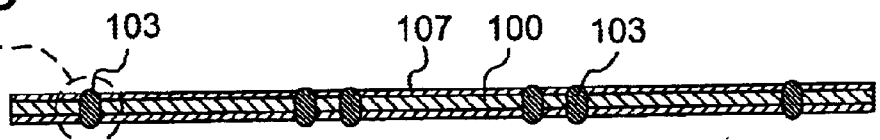
FIG. 4B is a vertical-sectional view of the heat sink strip in accordance with the present invention.
Figure 4C:
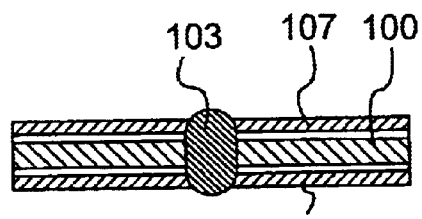

FIG. 4B is a vertical-sectional view of the heat sink strip fabricated by the method as shown in FIG. 4A.

As shown in the drawing, the solder ball 103 is inserted in the hole formed in the heat sink strip 100.

An oxide film 106 is formed on both surfaces of the aluminum heat sink strip. The oxide film 106 serves to insulate the heat sink strip 100 and each lead in the package.

Adhesive 107 forms a thermal gap above the upper surface of the oxide film 106, serving to attach the heat sink strip to the package.

FIGS. 5A through 5H illustrates a sequential process of fabricating the stacked semiconductor package in accordance with the present invention.

Figure 5A:
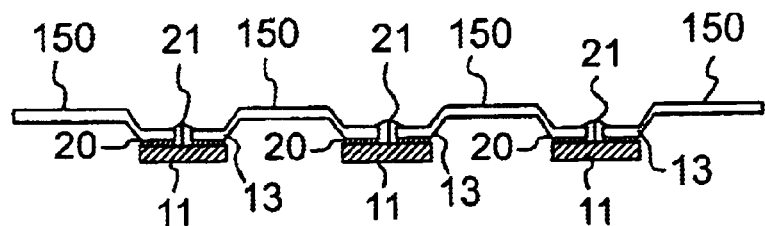
FIGS. 5A through 5H are a flow chart of sequential process of fabricating the stacked package in accordance with the present invention.

As shown in FIG. 5A, each of the first chips 11 is attached to each of the first leads 13 of the strip 150 by using the insulating tape 20.

Thereafter, the chip pad (not shown) on the respective first chip 11 and the respective first lead 13 are electrically connected by using the wire 21.

The strips are connected to each other by a side rail (not shown) to be integrated.

Figure 5B:
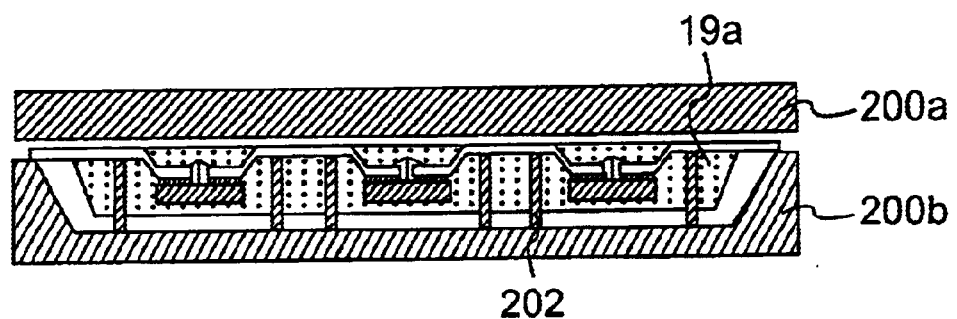

Next, as shown in FIG. 5B, a molding process is performed by a full molding method by using an upper mold 200a and a lower mold 200b, so as to form the first molding compound 19a. A plurality of protrusions 202 are formed to be spaced apart at predetermined intervals at the lower surface of the lower mold 200b.

Figure 5C:
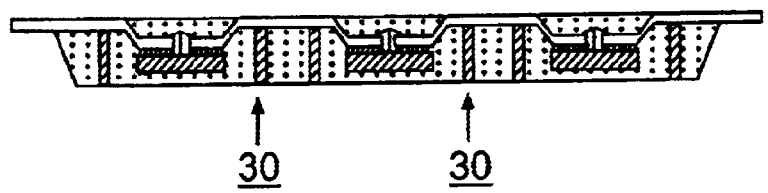

FIG. 5C illustrates a form made as the molding is completed.

As shown in the drawing, a plurality of holes 30 expose predetermined portions of the strip 150 within the first molding compound 19a due to the protrusions 202.

Figure 5D:
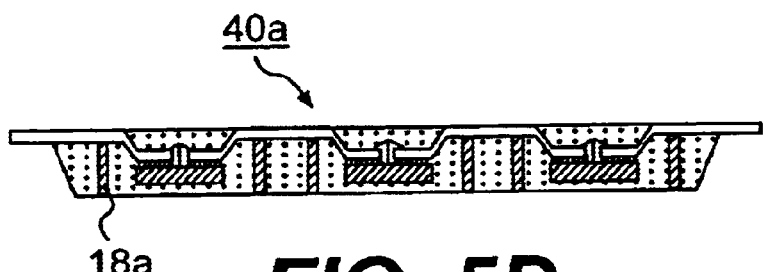

And, as shown in FIG. 5D, by filling the solder in the hole 30 and forming the plurality of first conductive portions 18a, the first package is completely fabricated except for the external terminal. And then, as shown in FIG. 5E, after the second package 40b is fabricated in the corresponding method of fabricating the first package 40a, the chip pad (not shown) of the first package 40a and the chip pad of the second package 40b are arranged to face each other.

The heat sink strip 100 as shown in FIG. 4B is positioned between the first package 40a and the second package 40b.

In this respect, the solder ball 103 is arranged to be in a row with the first conductive portion 18a and the second conductive portion 18b in a vertical direction.

Figure 5E:
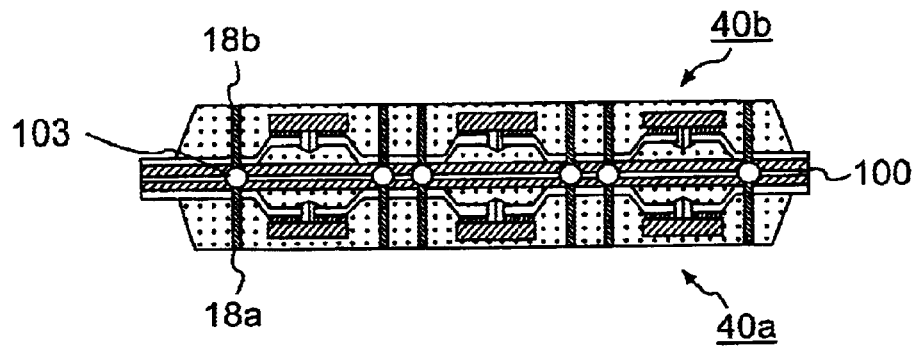
Figure 5F:
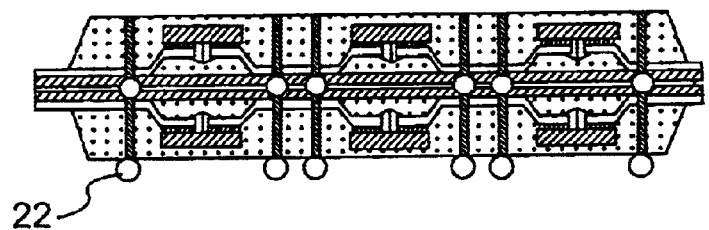

Next, as shown in FIG. 5F, a predetermined pressure and a temperature are applied thereto in the state of FIG. 5E and a solder reflow process is performed, thereby forming a stacking structure of the strip state.

Subsequently, external terminals 22 typically in solder ball form are attached to one side of each first conductive portion 18a exposed outwardly of the first molding compound 19a.

Figure 5G:
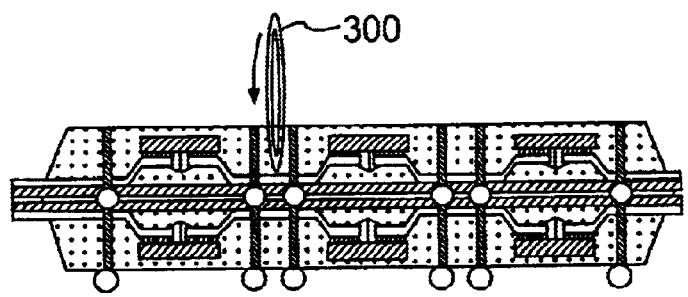

And then, the stacked structure in the strip state shown in FIG. 5F is cut to a unit stack chip size package as desired by using a saw method using a wheel 300 as shown in FIG. 5G.

Figure 5H:
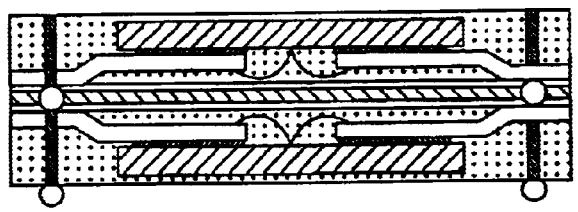

FIG. 5H shows the stack-type chip size package as completed according to the fabrication method as described above.

As so far described, according to the stacked semiconductor package of the present invention, rather than separately fabricating individual packages and stacking them as in the conventional art, the molding process and the stacking process are performed by strip unit for the package, which is cut by the saw method for fabricating the package, so that defective stacking can be reduced, productivity increased, and unit costs reduced.

In addition, by inserting the heat sink within the stacked package, heat generated by a high speed device or a high thermal dissipation device can be effectively released. Therefore, any malfunction of the device due to heat can be prevented, improving the stability of the device.

Furthermore, in the present invention, since the solder ball installed at the lower surface of the package is used as an external terminal rather than using outer leads, the size of the package can be reduced to be as small as the chip size.

Also, more than three chips can be stacked by using the conductive portion exposed on the upper surface of the package.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A stacked semiconductor package, comprising:

a first chip having chip pads on a first side;

a plurality of first leads of which a first side of each of the first leads is attached to the first side of the first chip by an insulating adhesive member formed within a circumferential boundary of the first side of the first chip, each of the first leads are electrically connected to the chip pads of the first chip;

a first molding compound for sealing the first chip and the first leads, including holes for exposing a predetermined portion of each of the first sides of the plurality of the first leads, and the first molding compound does not cover a second side of the first leads opposite the holes;

a first conductive portion formed within the holes included in the first molding compound;

an external terminal electrically connected to the first conductive portion;

a second chip having a plurality of second leads each having first sides attached on the second chip;

a second molding compound for sealing the second chip and the second leads and exposing a predetermined portion of a second side of each of the plurality of second leads; and a plurality of conductive connection units for electrically connecting the exposed predetermined portion of the second side of the second leads not covered with the second molding compound and the second side of the first leads not covered by the first molding compound.

2. The semiconductor package according to claim 1, wherein the external terminal is a solder ball.

3. The semiconductor package according to claim 1, further comprising a heat sink being attached between the first molding compound and the second molding compound, being connected to the plurality of conductive connection units, and having a side exposed outwardly.

4. The semiconductor package according to claim 1, wherein a hole is formed by the second molding compound exposing a predetermined portion of the first side of the second leads, and a second conductive portion is positioned inside the hole formed by the second molding compound to contact the predetermined portion of the first side of the second lead.

5. The semiconductor package according to claim 4, wherein the first conductive portion and the second conductive portion are made of a solder.

6. The semiconductor package according to claim 4, further includes at least one chip electrically connected to the first chip and the second chip through the second conductive portion.

7. The semiconductor package according to claim 3, wherein the heat sink is made of a metal having a high conductivity.

8. The semiconductor package according to claim 7, wherein the heat sink is attached to the first molding compound and the second molding compound by using an adhesive forming a thermal gap.

9. The semiconductor package according to claim 7, wherein the contour of the heat sink is surrounded by an insulation film.

* * * * *